United States Patent [19]

Kuwata

[11] Patent Number: 5,206,527

[45] Date of Patent: Apr. 27, 1993

[54] FIELD EFFECT TRANSISTOR

[75] Inventor: Nobuhiro Kuwata, Yokohama, Japan

[73] Assignee: Sumitomo Electric Industries, Ltd., Japan

[21] Appl. No.: 788,149

[22] Filed: Nov. 7, 1991

[30] Foreign Application Priority Data

Nov. 9, 1990 [JP] Japan .................... 2-305747
Jan. 9, 1991 [JP] Japan .................... 3-000976

[51] Int. Cl.⁵ .................... H01L 29/80; H01L 29/161
[52] U.S. Cl. .................... 257/191; 257/192
[58] Field of Search .................... 357/22, 16

[56] References Cited

U.S. PATENT DOCUMENTS

| 4,980,731 | 12/1990 | Hida | 357/22 |
| 5,091,759 | 2/1992 | Shih et al. | 357/22 |
| 5,105,241 | 4/1992 | Ando | 357/22 |

FOREIGN PATENT DOCUMENTS

| 61-166081 | 7/1986 | Japan | 357/22 |
| 61-276270 | 12/1986 | Japan | 357/22 |
| 63-90861 | 4/1988 | Japan | 357/22 |
| 63-272080 | 11/1988 | Japan | 357/22 |
| 63-318782 | 12/1988 | Japan | 357/22 |
| 64-2371 | 1/1989 | Japan | 357/22 |
| 64-57677 | 3/1989 | Japan | 357/22 |
| 64-82677 | 3/1989 | Japan | 357/22 |

Primary Examiner—Jerome Jackson, Jr.
Assistant Examiner—D. Monin
Attorney, Agent, or Firm—Beveridge, DeGrandi, Weilacher

[57] ABSTRACT

There is disclosed a field effect transistor comprising a channel layer formed of GaInAs and provided with a planar dope layer doped with an impurity in the form of a two-dimensional thin plane a cap layer and a buffer layer formed respectively in contact with the upper and lower faces of the channel layer, the cap layer and buffer layer being formed of GaInAs whose In composition ratio is lower than that of the channel layer first and a second semiconductor layers formed respectively in contact with the cap layer and the buffer layer, first and second semiconductor layers being formed of GaInAs whose In composition ratio is lower than GaAs or the cap layer and the buffer layer.

14 Claims, 9 Drawing Sheets

FIELD EFFECT TRANSISTOR

BACKGROUND OF THE INVENTION

1. Field of the Invention

The present invention relates to a field effect transistor, and in particular to a field effect transistor formed of a compound semiconductor of the GaAs system.

2. Related Background Art

A GaAs field effect transistor (hereinafter referred to as FET) has been researched and developed in various kinds for practical use as a high-frequency element because its carrier has greater saturation velocity and a higher saturation speed.

To allow such elements to be used at a more high-frequency, it is required to increase the transfer conductance (gm) by making the elements finer or by making the channel layer thinner and concurrently to improve gate-source resistance voltage and current driving function, for which various studies have been made and proposed.

For example, in the Japanese Patent Application Laid Open No. 166081/1986 and No. 276270/1986, there has been disclosed a FET having a channel wherein planar dope layers provided with an ionized donor are formed by a planar dope technique. In the Japanese Patent Application Laid Open No. 82677/1989, one form of the channel layer wherein two planar dope layers are provided within the mean free path of electron, is disclosed.

Examples aiming at the function due that GaInAs has greater electron saturation velocity and saturation speed compared with GaAs, are disclosed in the Japanese Patent Application Laid Open No. 272080/1988, No. 2371/31989, and No. 57677/1989. The Japanese Patent Application Laid Open No. 90861/1988 discloses one paying attention that Si has a higher doping efficiency etc. Furthermore, it is well known that, if GaInAs having smaller band gap is provided on GaAs, exudation of carrier to a GaAs buffer layer can be suppressed.

However, even in any of the conventional techniques described above, field effect transistors having satisfactory characteristics have not yet been realized. In the prior art using above planar dope technique, because the planar dope layer is provided between semiconductor layers with larger valence band, the enclosure of carrier might not be sufficiently achieved. In the prior art paying attention to a GaInAs characteristic as above, various drawbacks arise such that an irregularity of the lattice matching at the interface of GaAs and GaInAs increases.

Accordingly, there has yet not been realized a field effect transistor which is superior to terms of saturation velocity, confined efficiency of carrier, and doping efficiency, and making possible any of current driving function, transfer conductance, and gate-source resistance voltage.

SUMMARY OF THE INVENTION

It is an object of the present invention is to provide a field effect transistor having a greater saturation velocity, carrier confined efficiency, and doping efficiency.

It is another object of the present invention to provide a field effect transistor comprising a channel layer formed of GaInAs and provided with a planar dope layer doped with an impurity in the form of a two-dimensional thin plane a cap layer and a buffer layer formed respectively in contact with the upper and lower faces of the channel layer, the cap layer and buffer layer being formed of GaInAs of which In composition ratio is lower than that of the channel layer and first and a second semiconductor layers formed respectively in contact with the cap layer and the buffer layer, first and second semiconductor layers being formed of GaInAs of which In composition ratio is lower than that of GaAs or the cap layer and the buffer layer.

A field effect transistor of the invention is formed of a channel layer of GaInAs having a narrow valence band on a GaAs layer, having a wide valence band improving confined efficiency of carrier. Planar doping technology of an impurity improves doping efficiency and the formation of the planer doped layer in GaInAs layer improves mobility and saturation velocity of the carrier. The buffer layer and the cap layer is lower in In composition rate thereof then the channel layer, and further, preferably the In composition rate thereof are varied gradually so that the In composition rate thereof coincide with the substantially same value as that of the GaInAs channel layer in the interfaces between GaInAs channel layer, and the cap layer or the buffer layer, and their In composition rates become zero in the interfaces. And as the result, lattice matching between them can be realized. Further a shottky electrode can be formed on not GaInAs layer but GaAs layer and therefore good shottky junction can be realized.

Various modes of the present invention are explained referring to FIGS. 1A to 1D as follows. In the drawings, graphs on the left show composition rate and graphs on the right show donor concentration by "n" type impurity. FIG. 1A shows a case where a cap layer A and a buffer layer C have an In Composition coincident at interfaces with the upper and lower first and second semiconductor layers (GaAs) and with a channel layer at interface there between by continuously varying the In composition rate of GaInAs forming the cap layer and the buffer layer. Solid lines in the graphs show the case where a planar dope layer D is provided at the center of the channel layer B in (first embodiment hereinafter described), and dotted lines show another case where the planar dope layer D is identical to the channel layer.

FIG. 1B, shows the case where the In composition rates in the buffer layer and the cap layer are varied stepwise. In the example shown in the drawing, it is varied in two steps, however it may be varied in one, three or more step(s). FIG. 1C shows an example where the In composition rates in the buffer layer and the cap layer are continuously varied only at the sides contacting the channel layer. Dotted lines in FIG. 1C indicate an example where the planar dope layer is identical to the channel layer. FIG. 1D indicates the case in which the In composition rates in the cap layer and the buffer layer are discontinuously varied at the sides contacting the channel layer and are continuously varied at the outer sides.

In any of the cases described above, when a substrate uses GaAs, the channel layer has an In composition rate to the extent of $X=0.05$ to $0.3$ with $Ga_{1-x}In_xAs$ used, but preferably $X=0.10$ to $0.20$. This is because the saturation velocity of electrons is saturated at $X=0.10$ to $0.20$ in $Ga_{1-x}In_xAs$. The saturation velocity is not satisfactorily high compared with GaAs at $X=0.05$ or below, while it becomes difficult to prevent lattice irregularity at $X=0.3$ or above.

The planar dope layer, which is employed in the present invention, has a higher donor concentration and is formed of GaInAs having greater electron mobility and saturation velocity, therefore the carrier travels at a high speed. The planar dope layer is an extremely thin layer from several angstroms to several-ten angstroms thick, therefore the carrier travels within the planar dope layer and the GaInAs adjacent thereto, the width thereof being from several thick tens angstroms to one hundred and several tens angstroms. Accordingly, in the structure shown by solid lines in FIGS. 1A to 1D, the channel layer of GaInAs is essentially an electron path, and in the structure shown by dotted lines, the channel layer as well as the cap layer and buffer layer adjacent the channel layer are the electron path.

Incidentally, a surface layer provided with a substrate and a Schottky type gate electrode is preferred as a GaAs layer. In particular, if GaAs is used for the surface layer, the Schottky junction may be improved. However, the In may be included therein if the amount is very small, which is within the scope of the invention. To reduce resistance, an impurity is sometimes doped in the semiconductor layer at the lower sides of ohmic contact source and drain electrodes, however the dope layer is preferred to reach the channel layer.

In addition, when the substrate uses InP and not GaAs, the present invention can be applied. That is, because $Ga_{0.47}In_{0.53}As$ is lattice matched with InP, the same effect is obtained if the channel layer is, for example, $Ga_{0.32}In_{0.68}As$. In this case, the surface layer becomes a structure of $Al_{0.48}In_{0.52}As$ or a two-layered structure formed of the $Al_{0.48}In_{0.52}As$ and InP, whereby a Schottky gate electrode is formed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

An first embodiment of the invention will be explained referring to FIGS. 2A and 2B as follows.

Figure 1A:
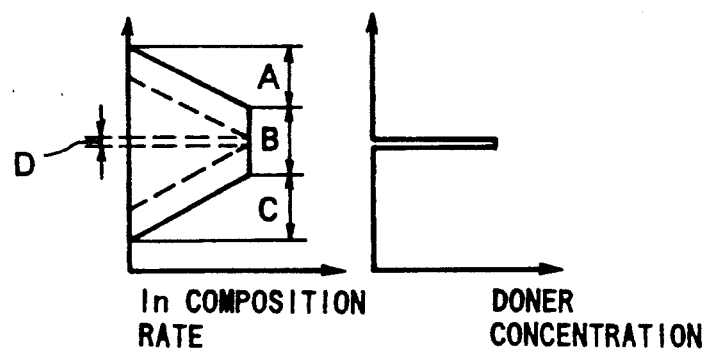
FIGS. 1A to 1D show a various made of the present invention.
Figure 1B:
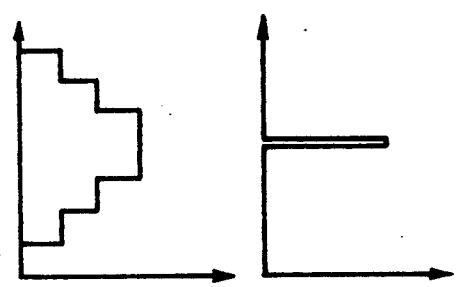
Figure 1C:
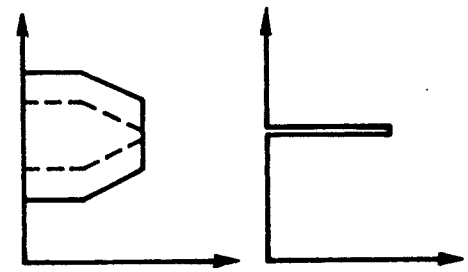
Figure 1D:
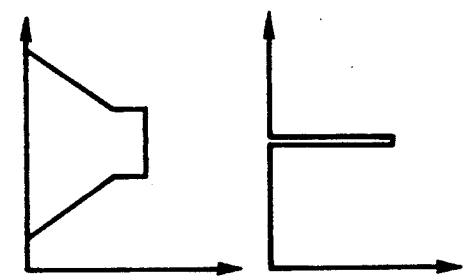
Figure 2A:
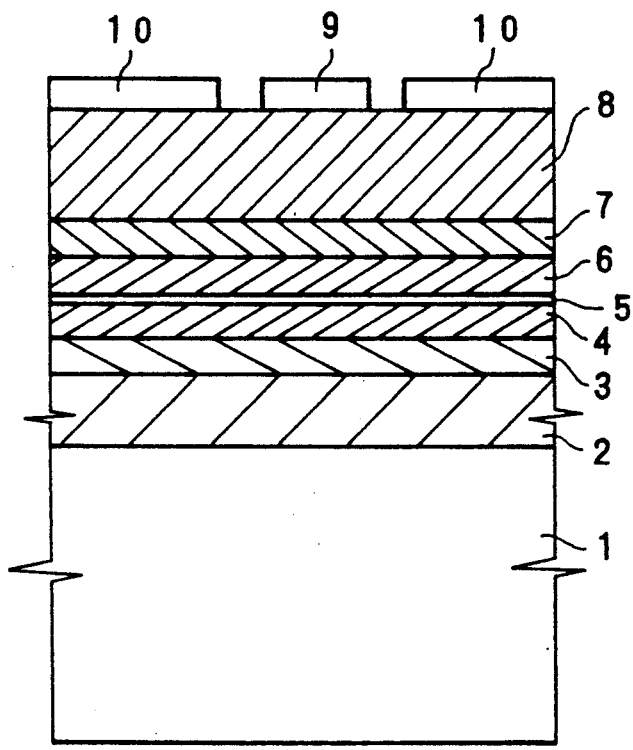
FIGS. 2A and 2B show the construction of a field effect transistor of one embodiment according to the present invention.
Figure 2B:
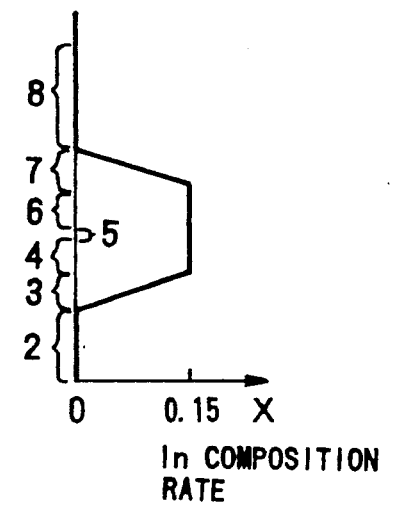

As shown in FIG. 2A, a field effect transistor of compound semiconductor which is one embodiment in accordance with the present invention is composed of a non-dope GaAs layer 2 formed with a thickness of 5000 angstroms on a substrate 1 of semi-insulating GaAs and a buffer layer 3 of $Ga_{1-x}In_xAs$ formed with thickness of 100 angstroms thereon. The buffer layer 3 is so formed that, the composition rate of In is $X=0$ at the interface with the non-dope GaAs layer 2, and this rate X is gradually increased as the distance from the non-dope GaAs layer 2 increases, finally becoming in X $=0.15$ at its top surface. Accordingly, at the interface of the non-dope GaAs layer 2 and the buffer layer 3, their composition rates are almost the same and lattice matching is realized.

On the upper portion of the buffer layer 3 is provided a channel layer, which is composed of a first $Ga_{0.85}In_{0.15}As$ layer 4, a planar dope layer 5 formed thereon by planar doping, and a second $Ga_{0.85}In_{0.15}As$ layer 6 provided further thereon. The composition rates of In in the GaInAs layers 4 and 6 are almost constant, thus at the interface of the first $Ga_{0.85}In_{0.15}As$ layer 4 and the buffer layer 3, those layers have almost the same composition rate, thereby lattice matching is realized. The planar dope layer 5 is formed by putting a thinner doping on a plane with an impurity such as Si or Se etc a "n" type donor for GaInAs.

A cap layer 7 comprising $Ga_{1-x}In_xAs$ with a thickness of 100 angstroms is provided on the channel layer. Unlike the buffer layer 3, the cap layer 7 is formed so that the composition rate X of In is 0.15 at the interface with the channel layer, the rate X performs lattice matching with the second $Ga_{0.85}In_{0.15}As$ layer 6 on the surface thereof, the rate X decreases as the distance from the layer increases and becomes zero at the top surface. Accordingly, at the interface of the second $Ga_{0.85}In_{0.15}As$ layer 6 and the cap layer 7, those composition rates are substantially the same, and lattice matching is thus realized. For convenience in explaining the In composition rate, FIG. 2B shows a vertical section of the In composition.

A non-dope GaAs layer 8 with a thickness of 300 angstroms is also provided on the cap layer 7. Thus, the non-dope layer 8 and the cap layer 7 have almost the same composition rate at the interface, and the irregularity of the lattice can be relaxed.

On the non-dope GaAs layer 8, a Schottky metal becoming a gate electrode 9 is formed, and an ohmic metal becoming a source / drain electrode 10 is also formed.

The difference between the field effect transistor in the embodiment described above and the conventional field effect transistor is explained referring to FIGS. 3A, 3B, 3C and 3D.

Figure 3A:
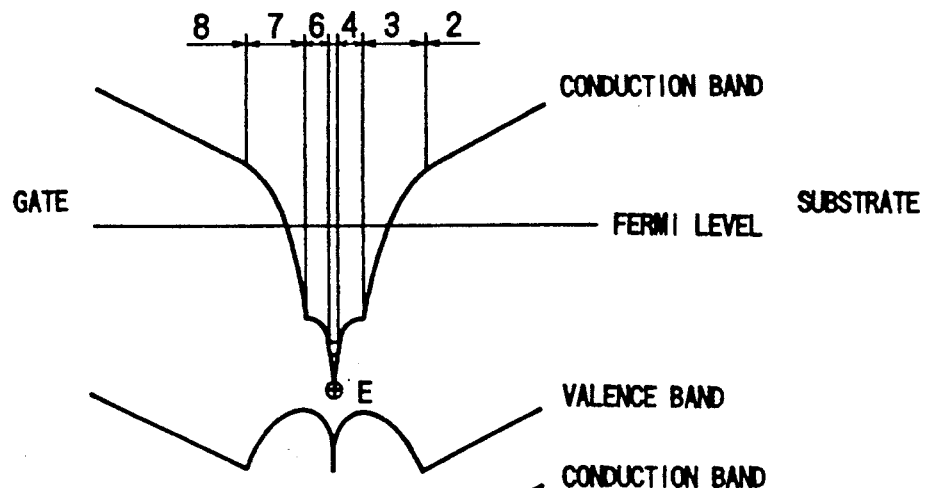
FIGS. 3A, 3B and 3C show band gap diagrams adjacent to channels of field effect transistors of the conventional example and the present invention.
Figure 3B:
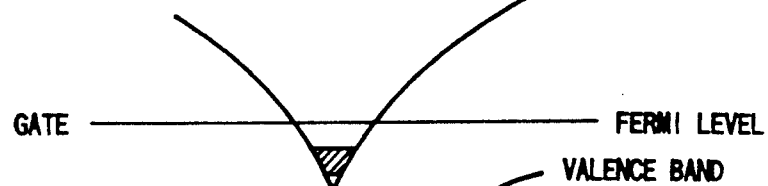
Figure 3C:
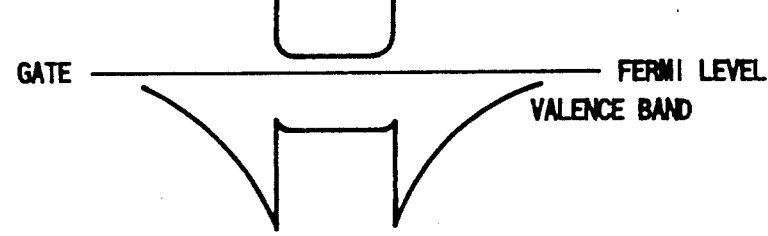

FIG. 3A shows a band gap diagram which is close to the channel of a field effect transistor of the embodiment described above, FIG. 3B is a band gap diagram, which is close to the channel of the field effect transistor formed by planar doping an impurity of the GaAs channel, and FIG. 3C is a band gap diagram, which is close to the channel of the field effect transistor formed by uniformly doping an "n" type impurity on the GaInAs channel layer. With comparing FIG. 3A with FIG. 3B, because the channel layer of GaInAs with a small band gap is used in the embodiment described above, apparently the confined efficiency of carrier is upgraded and exudation into the GaAs buffer layer hardly arises even in a region with a small drain current. With comparing FIG. 3A with FIG. 3C, by performing planar doping, electrons exist at the energy level where electrons are quantized as shown in FIG. 3A, and are spatially separated from ionized donors, thereby the influence of Coulomb scattering is reduced and saturation velocity in a lower electric field is not degraded.

Furthermore, saturation velocity of electron is much improved.

In the first embodiment described above, because the composition rates of In in the buffer layer 3 and the cap layer 7 are gradually varied and they are composed to be almost coincident to the composition rates of the non-dope GaAs layers contacting with the upper and lower surfaces thereof at their interfaces, the irregularity of the lattice matching is relaxed, and carrier saturation velocity is improved. In addition, with this connection, the contact surface of the Schottky metal, which becomes a gate electrode, can be made as a GaAs layer, and a good Schottky connection can thus be realized.

Next, a method of producing a field effect transistor of the embodiment described above will be explained briefly referring to FIGS. 4A, 4B, 4C, 4D, 4E and 4F.

A field effect transistor of the embodiment described above is produced by letting respective semiconductor layers grow on a semi-insulative GaAs substrate using OMVPE method, MBE method, CBE method, etc.

For example, a non-dope GaAs layer 2 of 5000 angstroms thickness is grown on the semi-insulating GaAs substrate 1 while supplying a predetermined material using any of the methods described above (see FIG. 4A). Next, a buffer layer of $Ga_{1-x}In_xAs$ is allowed to grow at a thickness of 100 angstroms to have the composition of In gradually increased from $X=0$, depending on growth thereof on the non-dope GaAs layer 2 and it becomes $X=0.15$ at its top surface by controlling the material to be supplied, (see FIG. 4A).

Next, by controlling the material to be supplied, a non-dope $Ga_{0.85}In_{0.15}As$ layer 4 having an almost uniform composition is allowed to grow at a thickness of 100 angstroms.

Figure 4A:
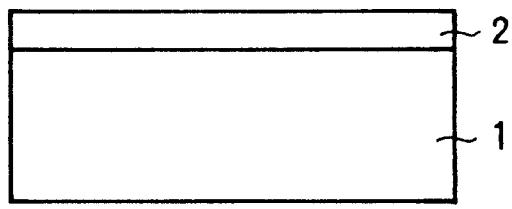
FIGS. 4A, 4B, 4C, 4D, 4E and 4F show the respective sectional constructions in the production processes of the field effect transistor as shown in FIG. 2A.
Figure 4B:
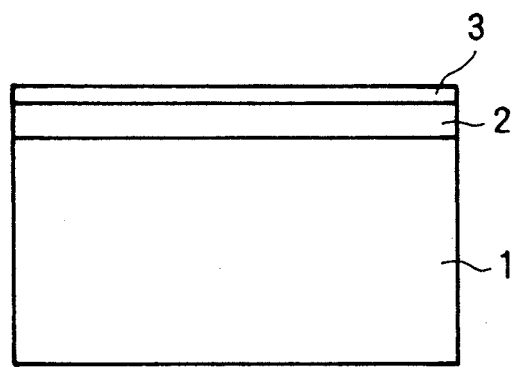
Figure 4C:
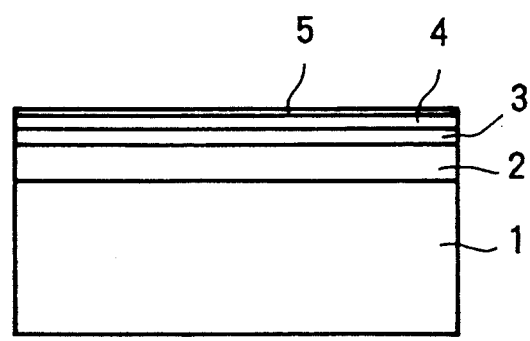
Figure 4D:
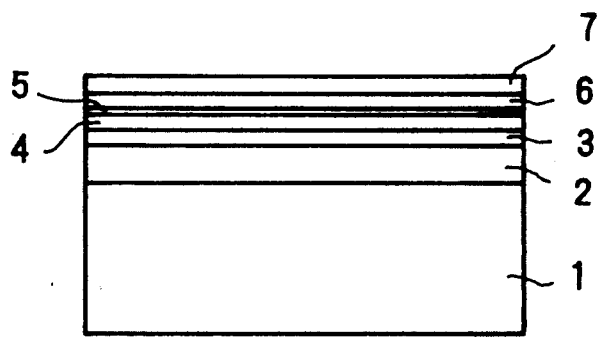
Figure 4E:
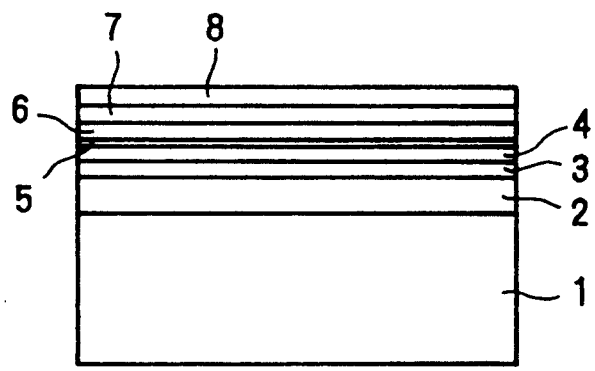

Subsequently, stopping the supply of material of III group chemical element namely Ga As, and while supplying the material As which is a V group element, planar doping in the form of a sheet is performed by supplying impurity element which can become "n" type donor, for example, Si or Se (See FIG. 4C). The detailed explanation of this planar doping method is omitted here because it is already well known to the public by documents etc.

Next, stopping the supply of material of "n" type impurity, starting the supply of Ga, As of III group elements again, and the non-dope $Ga_{0.85}In_{0.15}As$ layer 6 is allowed to grow at 100 angstroms. Thus, the channel layer for holding the planar dope layer 5 is formed.

The cap layer 7 of $Ga_{1-x}In_xAs$ is then allowed to grow. Growth in this case is performed in the same way as the buffer layer, that is, by controlling the supply of material of In, the cap layer 7 is allowed to grow at 100 angstroms so that to the In compositon increases gradually in the growing direction so as to vary from $X=0.15$ to $X=0$ (see FIG. 4D).

Figure 4F:
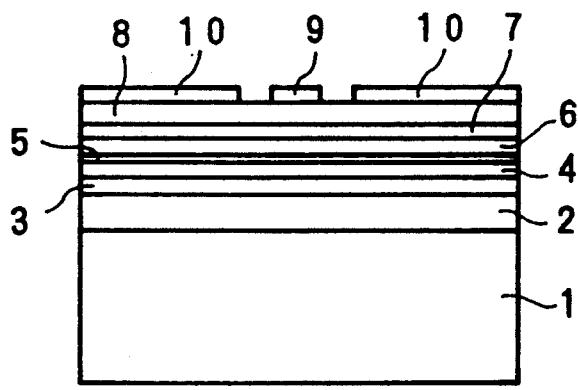

Next the non-doped GaAs layer 8 is allowed to grow on the cap layer 7 at 300 angstroms (see FIG. 4E), the Schottky metal is vapor deposited thereon, the gate electrode 9 is thus formed, then the source electrode and the drain electrode 10 are formed by evaporating the ohmic metal thereon and converting it into an alloy (see FIG. 4F).

Next, second embodiment of the invention are explained referring to FIGS. 5A and 5B as follows.

Figure 5A:
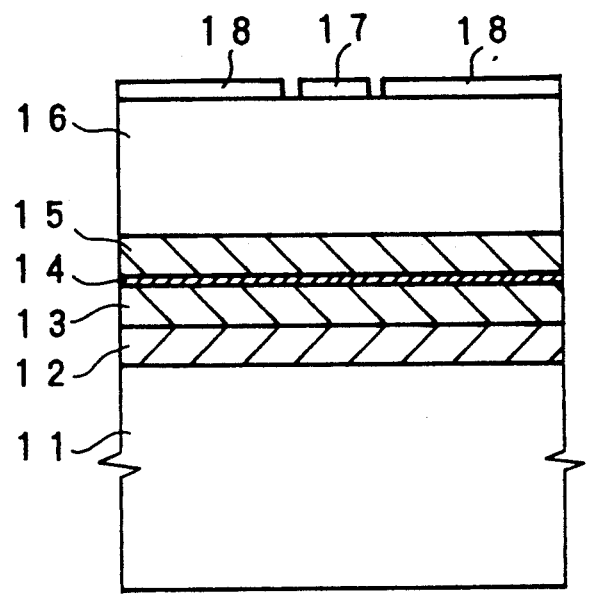
FIGS. 5A and 5B show diagrams of the a structure of a field effect transistor of one embodiment according to the present invention.
Figure 5B:
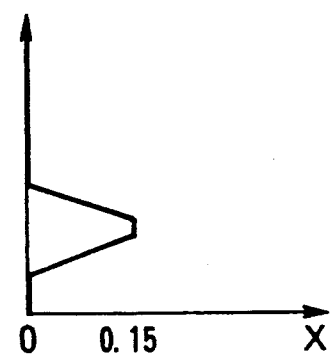

As shown in FIG. 5A, a field effect transistor of compound semiconductor being one embodiment in accordance with the present invention is composed of a non-dope GaAs layer 12 with thickness of 5000 angstroms formed on substrate 11 of semi-insulative GaAs and a buffer layer 13 of $Ga_{1-x}In_xAs$ with thickness of 100 angstroms formed thereon. The buffer layer 13 is so formed that In composition has a rate $X=0$ at the interface with the non-doped GaAs layer 12 and this rate X is gradually enlarged with the increase in the distance from the non-doped GaAs layer 12, finally resulting in $X=0.15$ at its top surface. Accordingly, the composition rate is substantially the same at the interface of the non-doped GaAs layer 12 and the buffer layer 13, where lattice matching is realized.

A channel layer 14 is provided immediately above the buffer layer 13. The channel layer 14 is formed by planar doping and the planar doped layer is formed by thinly doping an impurity such as Si, Se etc to be an "n" type donor for GaInAs onto a plane.

On the upper portion of the channel layer is provided a cap layer 15 formed by $Ga_{1-x}In_xAs$ with a thickness of 100 angstroms. Unlike the buffer layer 13, the cap layer 15 is formed so that the In composition rate X is 0.15 at the interface with the channel layer and is gradually decreased as the distance from the layer increases to become zero at its top surface. For an easier understanding of the state of In composition rate, a profile of the In composition in the depth direction is shown in FIG. 5B.

A non-doped GaAs layer 16 of 300 angstroms in thick is further provided on the cap layer 15.

Formed on the non-dope GaAs layer 16 is a gate electrode 17, and a source/drain electrode 18.

Figure 6A:
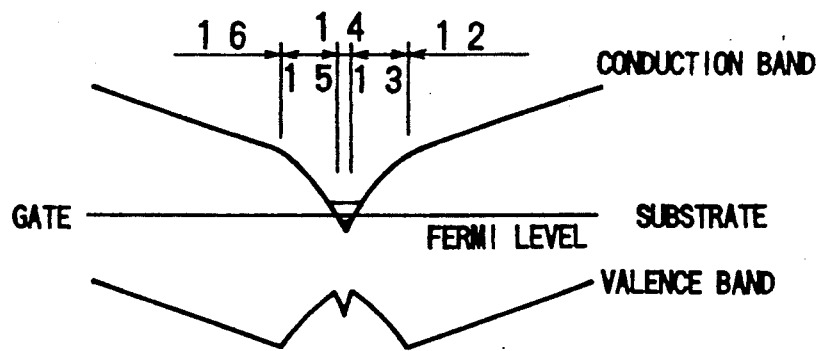
FIGS. 6A, 6B and 6C show band gap diagrams adjacent to channels of field effect transistors of the conventional example and the present invention.
Figure 6B:
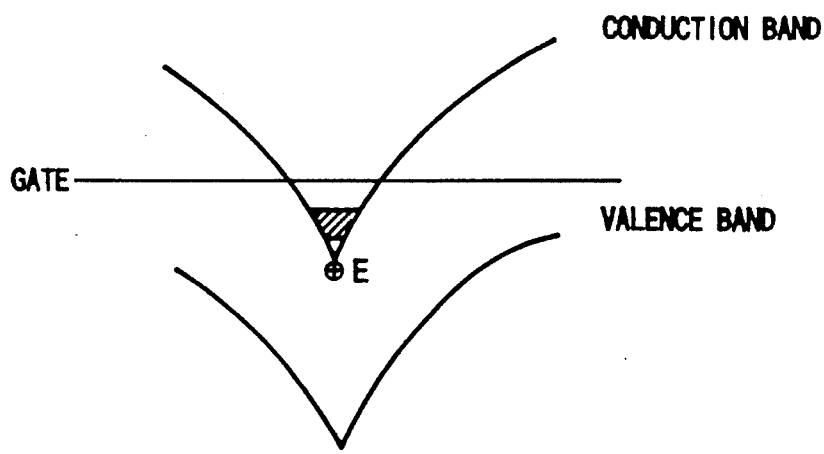
Figure 6C:
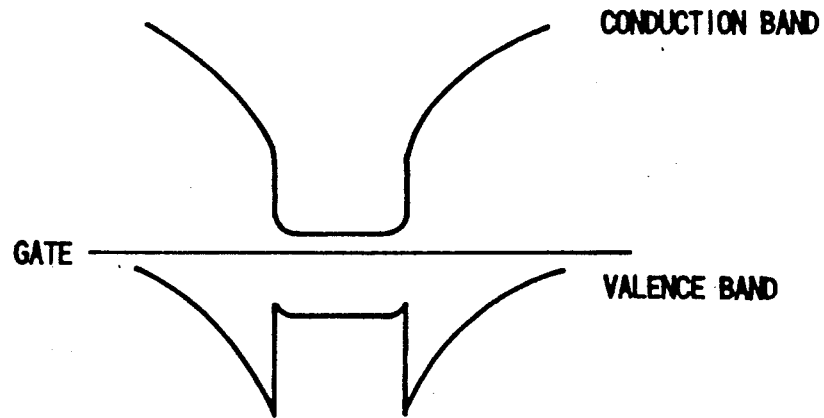

The difference between the field effect transistor in the embodiment described above and the conventional field effect transistor is explained referring to FIGS. 6A, 6B and 6C.

FIG. 6A is a band gap diagram adjacent to a channel of a field effect transistor of the embodiment hereinbefore described, FIG. 6B is a band gap diagram adjacent to a channel of a field effect transistor formed by planar doping an impurity on a channel of GaAs, and FIG. 6C is a band gap diagram adjacent to a channel of a field effect transistor having a channel layer of GaInAs formed by uniform doping of "n" type impurity. Comparing FIG. 6A with FIG. 6B, in the embodiment described above, because a buffer layer of GaInAs in which the band gap being gradually decreased is used and also a channel layer formed by planar doping is used, it is apparent that the confined efficiency of the carrier is upgraded and leaking into the GaAs buffer layer hardly arises even in a region of a small drain current. Comparing FIG. 6A with FIG. 6C, by planar doping, electrons exist at an energy level at which the electron is quantized as shown in FIG. 6A, and is spatially separated with an ionized donor, thereby the influence of Coulomb scattering is reduced and saturation velocity in a weaker electric field is not degraded. Furthermore, saturation velocity of electron is much improved.

Next, a method of producing a field effect transistor of the embodiment described above is briefly explained referring to FIGS. 7A, 7B and 7C.

A field effect transistor of the second embodiment described above is produced by allowing the respective semiconductor layers to grow on a semi-insulative GaAs substrate using the OMVPE method, the MBE method, the CBE method etc.

Figure 7A:
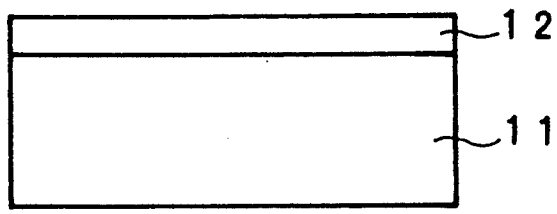
FIGS. 7A, 7B and 7C show respective sectional views in the first half of each production processes of the field effect transistor as shown in FIG. 5A.
Figure 7B:
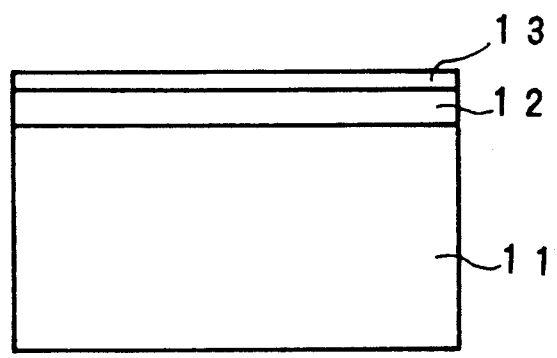
Figure 7C:
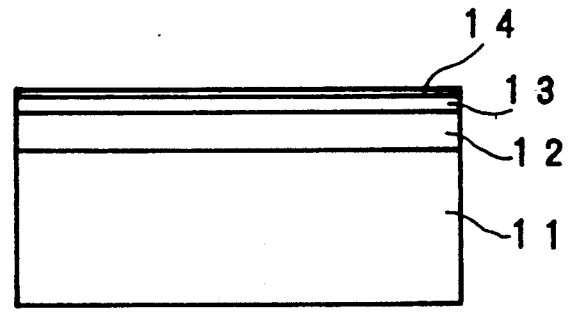

For example, the non-doped GaAs layer 12 is grown to 5000 angstroms on the semi-insulative GaAs substrate 11, while supplying a predetermined material using any of the methods hereinbefore described (see FIG. 7A). Next, controlling the material to be supplied, the buffer layer of $Ga_{1-x}In_xAs$ is allowed to grow to a thickness of 100 angstroms as the In composition gradually increases from X=0 on the non-doped GaAs layer 2 until it becomes X=0.15 at its top surface (see FIG. 7B).

Subsequently, the supply of material of III group chemical elements of Ga, As is stopped, and the material As of V group elements is supplied. Planar doping in the form of a sheet is then performed by supplying impurity element to be "n" type donor, for example, Si or Se (see FIG. 7C).

Figure 8A:
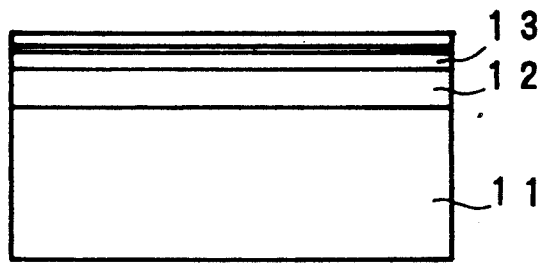
FIGS. 8A, 8B and 8C show respective sectional views in the latter half of production processes of the field effect transistor as shown in FIG. 5A.

The cap layer 15 of $Ga_{1-x}In_xAs$ is then allowed to grow. The buffer layer also grows by controlling the supply of the material of In, the In composition is increased gradually in the growing direction to vary from X=0.15 to X=0, so that the cap layer 15 can grow to 100 angstroms (see FIG. 8A).

Figure 8B:
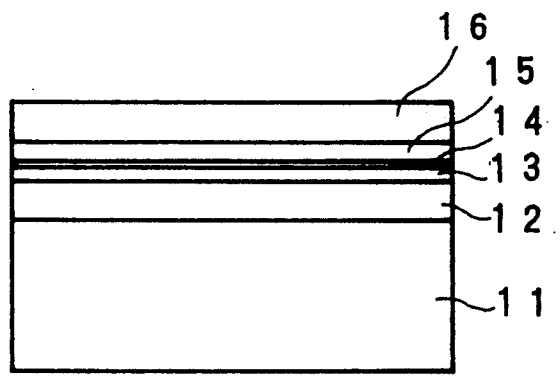
Figure 8C:
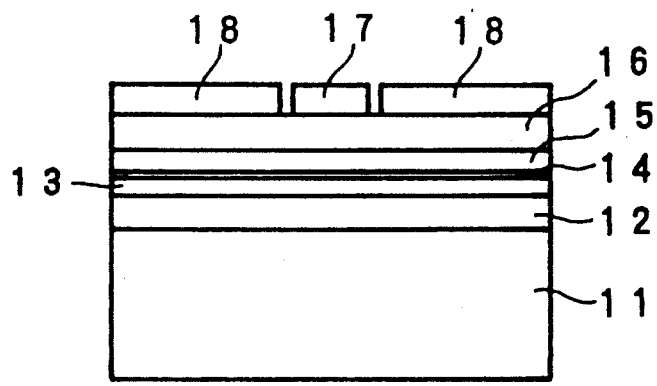

Next, the non-doped GaAs layer 6 is allowed to grow on the cap layer 5 to 300 angstroms (see FIG. 8B), the Schottky metal is vapor deposited thereon, to form a gate electrode 7, then the source and drain electrodes 8 are formed by converting the ohmic metal into an alloy through vapor depositon (see FIG. 8C).

A GaAs system has been fully described in the foregoing, and as is apparent from the above description, the present invention can be used not only for the GaAs system but also for an InP system. That is, an InP layer is grown on an InP substrate and a graded buffer layer made of GaInAs is formed thereon, the graded buffer layer of which In composition rate is gradually increased from X=0.53 at which GaInAs is lattice matched with InP to, for example X×0.68. Further planer doping is performed, and this doped layer is used as a channel layer. Further, a graded cap layer made of GaInAs is formed thereon, in which In composition rate is gradually decreased from X=0.68 to X=0.53 which the top layer of the graded cap layer have as In concentration rate and $Al_{0.48}In_{0.52}As$ layer is formed on this cap layer. Such a structure can be realized. Besides, it is possible that the channel layer is made to be thick and a planer dope layer is positioned in the center portion thereof.

As fully described above, according to the present invention, because the channel layer is formed of GaInAs produced by planar doping and the In composition within the upper and lower layers thereof are gradually varied to eliminate irregularity of the lattice, the confined efficiency of carrier is upgraded, a field effect transistor with higher mobility and saturation velocity could thus be realized.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:
   a channel layer made of GaInAs and having a planar doped layer formed by impurity doping in a thin plane;
   a cap layer and a buffer layer formed of GaInAs so as to sandwich and contact said channel layer therebetween, said cap layer and said buffer layer having an In concentration lower than a minimum In concentration of said channel layer;
   a first semiconductor layer underlying said buffer layer and having an In concentration lower than a minimum In concentration of said buffer layer; and
   a second semiconductor layer formed on said cap layer and having an In concentration lower than a minimum In concentration of said cap layer.

2. A transistor according to claim 1, wherein said planar doped layer is provided substantially centrally of said channel layer.

3. A transistor according to claim 1, wherein said cap layer and said buffer layer have In concentrations that increase from relatively lower concentrations away from said channel layer to relatively higher concentrations near said channel layer.

4. A transistor according to claim 1, wherein said cap layer and said buffer layer each have In concentrations that are substantially the same as an In concentration of said channel layer where said cap layer and said buffer layer contact said channel layer, and wherein said cap and buffer layers have lower In concentrations away from where said cap and buffer layers contact said channel layer.

5. A transistor according to claim 4, wherein said cap layer and said buffer layer have In concentrations which decrease with increasing distance from said channel layer.

6. A transistor according to claim 1, wherein said buffer layer has an In concentration which is substantially the same as an In concentration of said first semiconductor layer where said buffer layer contacts said first semiconductor layer, and has a greater In concentration at a distance from said first semiconductor layer.

7. A transistor according to claim 6, wherein said buffer layer has an In concentration which increases with distance from said first semiconductor layer.

8. A transistor according to claim 1, wherein said cap layer has an In concentration which is substantially the same as an In concentration of said second semiconductor layer where said cap layer contacts said second semiconductor layer, and has a greater In concentration at a distance from said second semiconductor layer.

9. A transistor according to claim 8, wherein said cap layer has an In concentration which increases with distance from said second semiconductor layer.

10. A transistor according to claim 1, wherein said planar doped layer is doped with an "n-type" impurity.

11. A transistor according to claim 10, wherein said "n-type" impurity is Si or Se.

12. A transistor according to claim 1, further comprising gate, source and drain electrodes formed on said second semiconductor layer.

13. A transistor according to claim 1, wherein said first and second semiconductor layers are made of GaAs.

14. A transistor according to claim 1, wherein said channel layer comprises semiconductor layers formed of GaInAs, said GaInAs semiconductor layers sandwiching said planar doped layer therebetween.

* * * * *